United States Patent
Fujikura (10) Patent No.: US 8,237,245 B2
(45) Date of Patent: Aug. 7, 2012

(54) NITRIDE SEMICONDUCTOR CRYSTAL, MANUFACTURING METHOD OF THE NITRIDE SEMICONDUCTOR FREESTANDING SUBSTRATE AND NITRIDE SEMICONDUCTOR DEVICE

(75) Inventor: Hajime Fujikura, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 153 days.

(21) Appl. No.: 12/870,332

(22) Filed: Aug. 27, 2010

(65) Prior Publication Data
US 2011/0198610 A1 Aug. 18, 2011

(30) Foreign Application Priority Data

Feb. 12, 2010 (JP) .................................. 2010-28434

(51) Int. Cl.
*H01L 29/207* (2006.01)
*H01L 21/22* (2006.01)

(52) U.S. Cl. .......... 257/615; 257/76; 257/196; 257/200; 257/201; 257/E29.093; 257/E21.138; 438/510

(58) Field of Classification Search .................. 257/76, 257/196, 200, 201, 615, E29.093, E21.138; 438/510

See application file for complete search history.

(56) References Cited

U.S. PATENT DOCUMENTS

| 6,657,300 | B2 * | 12/2003 | Goetz et al. .................... 257/745 |
| 7,345,323 | B2 * | 3/2008 | Goetz et al. .................... 257/101 |
| 7,456,445 | B2 * | 11/2008 | Takeda et al. .................. 257/200 |
| 2002/0016017 | A1 * | 2/2002 | Sakai et al. ...................... 438/57 |
| 2003/0160264 | A1 * | 8/2003 | Yagi et al. ...................... 257/183 |
| 2005/0167693 | A1 * | 8/2005 | Goetz et al. .................... 257/103 |
| 2005/0179107 | A1 * | 8/2005 | Pophristic et al. ............. 257/472 |
| 2007/0176211 | A1 * | 8/2007 | Kunze et al. .................... 257/232 |
| 2007/0228385 | A1 * | 10/2007 | Cao et al. ......................... 257/79 |
| 2007/0228407 | A1 * | 10/2007 | Takeda et al. ................. 257/101 |
| 2009/0121237 | A1 * | 5/2009 | Murofushi et al. ............. 257/88 |

OTHER PUBLICATIONS

Oshima et al, Prepareationg of Freestanding . . . , Jpn J Appl Phys, vol. 42 (2003) p. L1 to L3.
Motoki et al, Dislocatoin reduction in GaN crystal by advanced-DEEP, J. Crystal Growth, 305 (2007) 377-383.

* cited by examiner

*Primary Examiner* — Victor A Mandala
(74) *Attorney, Agent, or Firm* — Martin Fleit; Paul D. Bianco; Fleit Gibbions Gutman Bongini & Bianco PL (57) ABSTRACT

To provide a nitride semiconductor crystal, comprising: laminated homogeneous nitride semiconductor layers, with a thickness of 2 mm or more, wherein the laminated homogeneous nitride semiconductor layers are constituted so that a nitride semiconductor layer with low dopant concentration and a nitride semiconductor layer with high dopant concentration are alternately laminated by two cycles or more.

17 Claims, 4 Drawing Sheets

NITRIDE SEMICONDUCTOR CRYSTAL, MANUFACTURING METHOD OF THE NITRIDE SEMICONDUCTOR FREESTANDING SUBSTRATE AND NITRIDE SEMICONDUCTOR DEVICE

The present application is based on Japanese Patent Application No. 2010-028434, filed on Feb. 12, 2010, the entire contents of which are hereby incorporated by reference.

BACKGROUND OF THE INVENTION

1. Field of the Invention

The present invention relates to a nitride semiconductor crystal, a manufacturing method of a nitride semiconductor freestanding substrate and a nitride semiconductor device, and further specifically, to the nitride semiconductor crystal from which a plurality of nitride semiconductor freestanding substrates can be obtained, a manufacturing method of the nitride semiconductor freestanding substrate for manufacturing the nitride semiconductor freestanding substrate from the nitride semiconductor crystal, and the nitride semiconductor device manufactured by using the nitride semiconductor freestanding substrate.

2. Description of the Related Art

A nitride semiconductor represented by gallium nitride (GaN), aluminium gallium nitride (AlGaN), and indium gallium nitride (InGaN), is highlighted as a light emitting device material for covering a wavelength region from ultraviolet to green color, and also as an electronic device material having high temperature operation and high output operation.

In a case of a conventional semiconductor other than the nitride semiconductor, in most cases, a freestanding substrate is prepared comprising a single crystal, which is the same kind as the semiconductor, and a device structure is formed thereon by each kind of crystal growth method, to thereby realize and put to practical use various devices.

Meanwhile, in a case of the nitride semiconductor, it is difficult to obtain a single crystal freestanding substrate composed of the nitride semiconductor such as GaN and AlN, and therefore there is no other choice but to use a hetero-substrate such as sapphire and SiC. In this case, high density defect (dislocation) is generated in a nitride semiconductor layer that grows on the hetero-substrate, and this is a major factor of preventing improvement of device characteristics. If explained with a typical case as an example, a service life of a semiconductor laser depends on a dislocation density in a crystal strongly, and therefore in a nitride semiconductor element formed by a crystal growth on the hetero-substrate, it is difficult to obtain a practical service life of the element.

In recent years, a GaN single crystal freestanding substrate with low defect density has been supplied by each kind of method, and the semiconductor laser using the nitride semiconductor is finally put to practical use. Various methods are proposed as manufacturing methods of the GaN freestanding substrate. As a typical one of them, a method of growing GaN thick on a seed substrate by HVPE (Hydride Vapor Phase Epitaxy), and removing the seed substrate during growth or after growth; an Na flux method of separating GaN on the seed crystal by pressuring an entire body by nitrogen in a state that Ga metal contained in a melted Na; a high pressure synthesizing method of directly synthesizing GaN from Ga and nitrogen at high temperature and under high pressure; an ammonothermal method of dissolving Ga and GaN into ammonia and separating GaN on the seed crystal at a lower temperature and under a lower pressure than the high pressure synthesizing method, and a sublimation method of synthesizing GaN from Ga vapor and ammonia, are known.

Among above-described methods, several methods using HVPE are most successful at the present point. Then, by polishing front/rear surfaces of a freestanding single crystal of GaN manufactured by the method using HVPE, the GaN freestanding substrate with large area (diameter of 2 to 3 inches) is realized. As a method of using typical HVPE, a method of vapor-depositing Ti on the surface of a GaN thin film on a sapphire substrate, forming voids by applying heat treatment thereto, growing GaN thick thereon by HVPE, and separating the sapphire substrate from the void portion (Void-Assisted Separation Method:VAS method, see document 1); and a method of growing GaN thick on the GaAs substrate with a surface partially covered with an insulating mask by HVPE, and thereafter removing the GaAs substrate (DEEP method, see document 2), are known.

(Document 1) Yuichi OSHIMA et al., Japanese Journal of Applied Physics, Vol. 42 (2003), pp. L1-L3

(Document 2) Kensaku Motoki et al., Journal of Crystal Growth, Vol. 305 (2007), pp. 377-383.

SUMMARY OF THE INVENTION

However, the GaN substrate manufactured by the method using the aforementioned HVPE still requires a high cost, and a current situation is that there is a cost difference of ten times or more per unit area, if compared between the GaN substrate and conventional GaAs or InP substrate. This is because since a freestanding single crystal with a thickness of 1 mm or more is hardly obtained by the aforementioned methods, only one freestanding substrate can be obtained from the freestanding single crystal obtained by growth of once.

The method of using the HVPE is the method of growing a nitride semiconductor freestanding single crystal on a hetero-substrate, and therefore high density dislocation is introduced into a single crystal at the initial time of the growth. The dislocation density is reduced as the nitride semiconductor freestanding single crystal grows. However, distortion is introduced to the nitride semiconductor single crystal in the process of such a reduction of the dislocation. If the nitride semiconductor freestanding single crystal becomes thick, strain energy (stress energy) accumulated inside of the crystal becomes great, and when this strain energy exceeds a critical value, cracks and breakage are generated in the nitride semiconductor crystal. Thus, the nitride semiconductor freestanding single crystal is not grown thick by the method using the HVPE.

Meanwhile, when the conventional GaAs and InP are grown by a method such as an LEC method, the strain generated inside of the crystal is small, because homogeneous single crystal such as GaAs and InP is used as a seed crystal, and the single crystal with a length of several tens of "cm" can be obtained by one growth. By slicing and polishing such a single crystal, several sheets to 100 sheets of substrates can be obtained from one single crystal. Therefore, the GaAs substrate and the InP substrate can be produced at a significantly lower cost than the cost of the GaN substrate.

Accordingly, if the nitride semiconductor single crystal can be manufactured without generating breakage and cracks so as to be thick enough to use the slicing step, namely formed in a thickness (typically 2 mm or more), the manufacturing cost of the nitride semiconductor freestanding substrate can be considerably reduced.

An object of the present invention is to provide a nitride semiconductor crystal having a structure from which a plurality of sheets of nitride semiconductor freestanding substrates can be obtained without breakage and cracks, a manufacturing method of the nitride semiconductor freestanding substrates capable of manufacturing the nitride semiconductor freestanding substrates at a low cost, and an inexpensive nitride semiconductor device.

According to an aspect of the present invention, a nitride semiconductor crystal is provided, comprising:

laminated homogeneous nitride semiconductor layers, with a thickness of 2 mm or more, wherein the laminated homogeneous nitride semiconductor layers are constituted so that a nitride semiconductor layer with low dopant concentration and a nitride semiconductor layer with high dopant concentration are alternately laminated by two cycles or more.

According to other aspect of the present invention, a manufacturing method of a nitride semiconductor freestanding substrate is provided, comprising the steps of:

forming a nitride semiconductor crystal with a thickness of 2 mm or more on a base substrate, composed of homogeneous nitride semiconductor layers, in which a nitride semiconductor layer with low dopant concentration and a nitride semiconductor layer with high dopant concentration, are laminated by 2 cycles or more; and slicing the nitride semiconductor crystal formed by lamination on the base substrate, with the nitride semiconductor layer with low dopant concentration as a cutting position.

DESCRIPTION OF PREFERRED
EMBODIMENTS OF THE INVENTION

The knowledge and a schematic explanation for the present invention will be given, prior to the explanation for an embodiment of a manufacturing method of a nitride semiconductor crystal and a nitride semiconductor freestanding substrate according to the present invention.
(Knowledge and Schematic Explanation for the Invention)

As described above, the reason for generating the breakage and cracks during crystal growth of the nitride semiconductor crystal is a stress (strain) accumulated inside of the crystal during growth. When the stress energy (strain energy) accumulated in a part of the crystal exceeds a critical value, this part begins to be plastically deformed, and when the stress energy is further strengthened, the breakage and cracks of the crystal are generated. Here, plastic deformation is a phenomenon that the crystal is deformed irreversibly while generating a new dislocation in the crystal. Namely, it can be said that the critical value of the stress that allows the plastic deformation to begin, is a stress by which the new dislocation is introduced into the crystal. Further, if a critical stress by which the dislocation introduced, can be controlled, it can be considered that the breakage and cracks of the nitride semiconductor crystal can be controlled.

Therefore, inventors of the present invention examines in detail, an influence of various parameters during crystal growth, on an easy plastic deformation of the nitride semiconductor crystal. As a result, it is found that easy plastic deformation of the crystal is greatly varied, depending on the dopant concentration in the crystal. Namely, when the dopant concentration in the nitride semiconductor crystal is low, the crystal is hardly plastically deformed, and when the dopant concentration in the nitride semiconductor crystal is high, the crystal is easily plastically deformed. Particularly, it is clarified that when the dopant concentration in the nitride semiconductor crystal is $5 \times 10^{17}$ cm$^{-3}$ or more, irrespective of the kind of the dopant added into the crystal, the crystal is extremely easily plastically deformed, thus easily generating the breakage and cracks.

Details of a mechanism of variation of the easy plastic deformation depending on the dopant concentration, has not been clarified yet. However, there is a high possibility that this is mainly caused by a point defect concentration by addition of dopant into the nitride semiconductor crystal. An object of adding the dopant into the nitride semiconductor crystal is mainly to control electric characteristics of the crystal. Therefore, in most cases, the dopant ionized in the crystal is added. When the dopant ionized in the crystal, is added into the crystal, the point defect of an electric charge opposite to that of a dopant ion is easily introduced into the crystal, to maintain an electric charge neutrality of an entire body of the crystal. For example, n-type dopants such as Si and Ge are ionized to positive by emitting electrons in the nitride semiconductor crystal. Therefore, for example, when GaN crystal is doped with Si, negatively charged Ga vacancy is formed in the GaN crystal. Reversely, when the GaN crystal is doped with Mg and Zn, being p-type dopants, positively charged nitrogen vacancy is formed. When the dopant concentration is high, the concentration of such point defects (such as Ga vacancy and nitrogen vacancy) is also high. In the crystal with high vacancy concentration as described above, it can be considered that when the stress is added, vacancies are aggregated so as to reduce the stress energy in the crystal, thus easily forming a dislocation loop. Also, it can be considered that when the dislocation loop, being an origin of such a growth of dislocations, exists in the crystal, the crystal is easily plastically deformed.

When the dopant concentration in the nitride semiconductor crystal is small (less than $5 \times 10^{17}$ cm$^{-3}$), the breakage of the crystal hardly occurs, and therefore a thick nitride semiconductor crystal can be easily formed. However, in such a so-called "undoped" crystal or the crystal with low dopant concentration, industrial meaning is small even if the nitride semiconductor crystal without breakage can be obtained.

As an industrially requested nitride semiconductor freestanding substrate, n-type or p-type (carrier concentration is $1 \times 10^{18}$ cm$^{-3}$ or more) conductive substrate with low resistance, or a semi-insulating substrate (including Fe, etc, of $1 \times 10^{18}$ cm$^{-3}$ or more) with resistivity of $1 \times 10^5$ Ωcm or more, can be given in most cases. Thus, in order to obtain the industrially useful n-type or p-type conductive nitride semiconductor substrate or the semi-insulating nitride semiconductor substrate, the dopant concentration needs to be set to $1 \times 10^{18}$ cm$^{-3}$ or more in a case of Si, $5 \times 10^{19}$ cm$^{-3}$ or more in a case of Mg, and $1 \times 10^{18}$ cm$^{-3}$ or more in a case of Fe. However, it is extremely difficult to grow the nitride semiconductor crystal thick uniformly having such a high dopant concentration, without generating the breakage or cracks.

However, from a practical viewpoint, the nitride semiconductor crystal does not need to have a uniform dopant concentration in its thickness direction. Specifically speaking, the nitride semiconductor freestanding substrate can be formed by slicing a thick nitride semiconductor crystal, wherein, a sliced portion is not included in a final nitride semiconductor freestanding substrate. Therefore, there is no necessary for adding the dopant to the sliced portion.

Actually, when the nitride semiconductor crystal is manufactured, having a lamination structure in which the nitride semiconductor layer (specifically a layer with dopant concentration of $5\times10^{17}$ cm$^{-3}$ or more) with high dopant concentration containing dopants such as n-type dopants, p-type dopants, or semi-insulating dopants; and the nitride semiconductor layer (specifically a layer with dopant concentration of less than $5\times10^{17}$ cm$^{-3}$) with low dopant concentration containing dopants lower than the nitride semiconductor layer with high dopant concentration, although which is the same kind of the nitride semiconductor layer (homogeneous layer) as the aforementioned nitride semiconductor layer with high dopant concentration, are alternately laminated, it is clarified that even if the thickness of the nitride semiconductor crystal exceeds 2 mm, the nitride semiconductor crystal without breakage and cracks can be easily realized. The reason can be considered as follows. Namely, although the nitride semiconductor layer with high dopant concentration is easily plastically deformed and broken, when the nitride semiconductor layer with low dopant concentration which is hardly plastically deformed, is inserted into the nitride semiconductor layers with high dopant concentration, the nitride semiconductor layer with low dopant concentration functions as a support for preventing the plastic deformation, thus preventing the breakage and cracks of the crystal.

The aforementioned nitride semiconductor layer with low dopant concentration is hardly plastically deformed and functions to prevent the plastic deformation of the crystal, and is a layer that may be removed when the crystal is sliced to manufacture the freestanding substrate, and which is preferably the nitride semiconductor layer with considerably lower dopant concentration than the nitride semiconductor layer with high dopant concentration. Namely, the nitride semiconductor layer with low dopant concentration is preferably set as an undoped layer (including a case that the dopants are inevitably contained with low concentration) which is grown, with no dopant raw materials supplied thereto.

Thus, an inventor of the present invention manufactures the nitride semiconductor crystal with a thickness of 2 mm to 35 mm having a lamination structure in which the nitride semiconductor layer with high dopant concentration and the nitride semiconductor layer with low dopant concentration are alternately laminated, then slice such a nitride semiconductor crystal, and succeeds in obtaining 3 to 100 nitride semiconductor freestanding substrates from one nitride semiconductor crystal. Conventionally, when it is taken into consideration that only one nitride semiconductor freestanding substrate can be obtained from one nitride semiconductor freestanding single crystal, improvement of about hundredfold productivity is achieved, and therefore it can be said that this is a manufacturing technique capable of significantly reducing a manufacturing cost of the nitride semiconductor freestanding substrate.

By forming the nitride semiconductor layer having each kind of device structure on the freestanding substrate obtained as described above, by using Metal Organic Vapor Phase Epitaxy (MOVPE), etc, a laser diode (LD), a light emitting diode (LED), a photo diode (PD), a high electron mobility transistor (HEMT), and a hetero bipolar transistor (HBT) can be realized at considerably lower cost than conventional.

An Embodiment

Next, an embodiment of the nitride semiconductor crystal and a manufacturing method of the nitride semiconductor freestanding substrate will be described, by using the drawings.

(Nitride Semiconductor Crystal)

Figure 1:
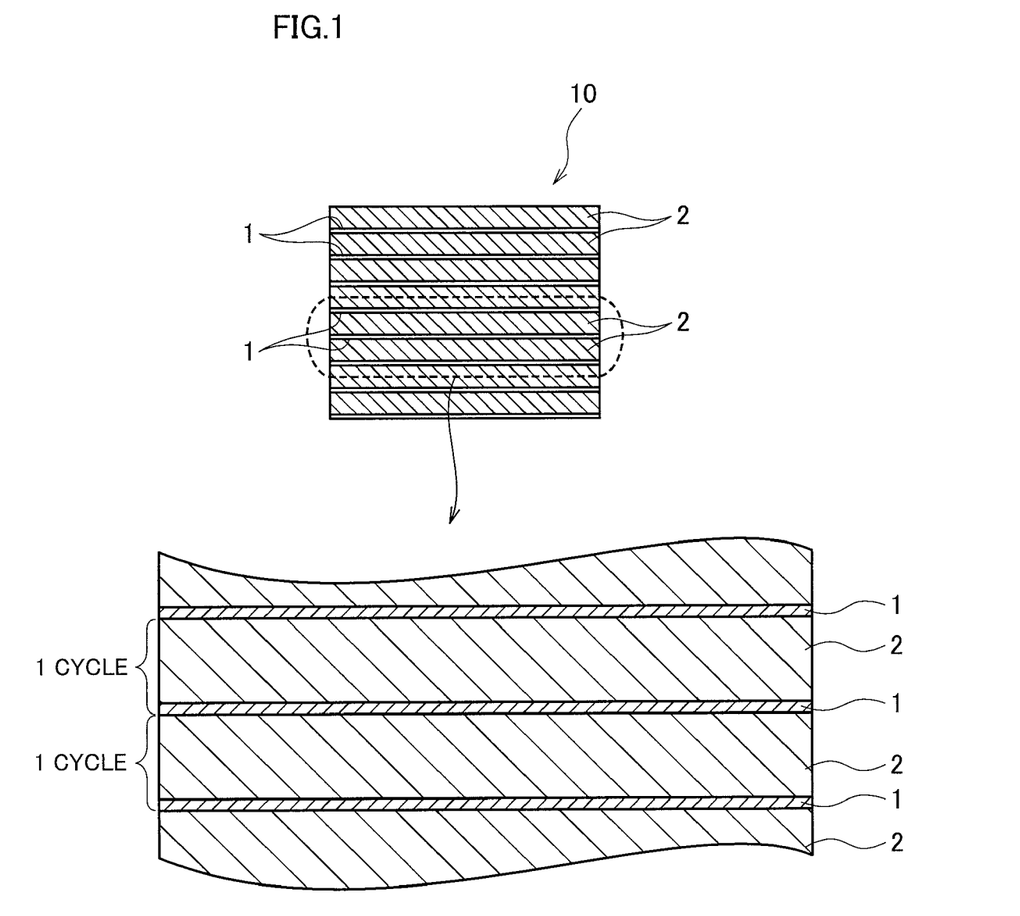
FIG. 1 is a schematic cross-sectional view showing an embodiment of a nitride semiconductor crystal according to the present invention.

FIG. 1 shows a schematic cross-sectional view of the nitride semiconductor crystal according to an embodiment of the present invention. As shown in FIG. 1, the nitride semiconductor crystal 10 of this embodiment has a structure of two cycles or more of alternate lamination of a nitride semiconductor layer 1 with low dopant concentration and a nitride semiconductor layer 2 with high dopant concentration. As shown in a lower part of FIG. 1 in which a portion surrounded by broken line of an upper part of FIG. 1 is expanded, one cycle is constituted of one nitride semiconductor layer 1 with low dopant concentration and one nitride semiconductor layer 2 with high dopant concentration adjacent to the nitride semiconductor layer 1, and the nitride semiconductor crystal 10 is laminated with a thickness of 2 mm or more by repeating this cycle structure by 2 cycles or more. The nitride semiconductor layer 1 with low dopant concentration and the nitride semiconductor layer 2 with high dopant concentration are homogeneous nitride semiconductor layers, and for example, if the nitride semiconductor layer 1 with low dopant concentration is a GaN layer, the nitride semiconductor layer 2 with high dopant concentration is also the GaN layer. Also, if the nitride semiconductor layer 1 with low dopant concentration is an $Al_xGa_{1-x}N$ ($0<x<1$) layer, the nitride semiconductor layer 2 with high dopant concentration is also the $Al_xGa_{1-x}N$ ($0<x<1$) layer. As the nitride semiconductor crystal 10, AlN, InN, $In_yGa_{1-y}N$ ($0<y<1$), etc, can also be given, other than GaN, $Al_xGa_{1-x}N$ ($0<x<1$).

The dopant concentration of the nitride semiconductor layer 1 with low dopant concentration is preferably set to less than $5\times10^{17}$ cm$^{-3}$, and the dopant concentration of the nitride semiconductor layer 2 with high dopant concentration is preferably set to $5\times10^{17}$ cm$^{-3}$ or more. In the nitride semiconductor crystal with a thickness of 2 mm or more, when the dopant concentration is $5\times10^{17}$ cm$^{-3}$ or more, the crystal is extremely easily plastically deformed, irrespective of the kind of the dopants added to the crystal, thus lowering a yield at which the crystal without breakage and cracks can be obtained (see FIG. 4). Accordingly, in order to grow the nitride semiconductor crystal with a thickness of 2 mm or more without breakage and cracks, the dopant concentration of the nitride semiconductor layer 1 with low dopant concentration is set to less than $5\times10^{17}$ cm$^{-3}$, and the plastic deformation of the nitride semiconductor crystal 10 needs to be suppressed. The nitride semiconductor layer 1 with low dopant concentration is preferably set as the undoped layer with considerably lower dopant concentration than the nitride semiconductor layer 2 with high dopant concentration.

The thickness is set to 2 mm or more, regarding the nitride semiconductor crystal having the lamination structure in which the nitride semiconductor layer 1 with low dopant concentration and the nitride semiconductor layer 2 with high dopant concentration are alternately laminated by 2 cycles or more, for making it possible to obtain a plurality of nitride semiconductor freestanding substrates and obtaining an inexpensive nitride semiconductor freestanding substrate.

Meanwhile, the dopant concentration of the nitride semiconductor layer 2 with high dopant concentration is set to $5 \times 10^{17}$ cm$^{-3}$ or more, for obtaining industrially useful n-type or p-type conductive nitride semiconductor substrate and a semi-insulating nitride semiconductor substrate, and for example, the dopant concentration is preferably set to $1 \times 10^{18}$ cm$^{-3}$ or more in a case of Si, being a n-type dopant, $5 \times 10^{19}$ cm$^{-3}$ or more in a case of Mg, being a p-type dopant, and $1 \times 10^{18}$ cm$^{-3}$ or more in a case of Fe, being a semi-insulating dopant.

A grated layer of the nitride semiconductor, with dopant concentration continuously increased or decreased, or the nitride semiconductor layer with dopant concentration intermediate between the nitride semiconductor layer 1 with low dopant concentration and the nitride semiconductor layer 2 with high dopant concentration, may be provided between the nitride semiconductor layer 1 with low dopant concentration and the nitride semiconductor layer 2 with high dopant concentration.

Further, a nitride semiconductor layer (heterogeneous nitride semiconductor layer) of a different kind from the nitride semiconductor layer with a lamination structure in which the nitride semiconductor layer 1 with low dopant concentration and the nitride semiconductor layer 2 with high dopant concentration are laminated, may be provided before and after the nitride semiconductor crystal 10, or in the nitride semiconductor crystal 10, namely before and after a portion where the nitride semiconductor layer 1 with low dopant concentration and the nitride semiconductor layer 2 with high dopant concentration are alternately laminated by 2 cycles or more.

The thickness of the nitride semiconductor layer 1 with low dopant concentration is preferably set to $\frac{1}{20}$ or more (more preferably $\frac{1}{16}$ or more) of the thickness of the nitride semiconductor layer 2 with high dopant concentration. This is because the nitride semiconductor layer 1 with low dopant concentration functions to prevent the plastic deformation of the nitride semiconductor crystal 10 as described above. Accordingly, the nitride semiconductor layer 1 is preferably provided at a ratio of $\frac{1}{20}$ or more, with respect to the thickness of the nitride semiconductor layer 2 with high dopant concentration.

Further, the nitride semiconductor layer 1 with low dopant concentration corresponds to a cutting place in manufacturing the nitride semiconductor freestanding substrate by slicing the nitride semiconductor crystal 10, and it can be said that this is preferably a layer not included in a final nitride semiconductor freestanding substrate. Accordingly, the thickness of the nitride semiconductor layer 1 with low dopant concentration can be taken up to a thickness obtained by adding a cutting margin for cutting the nitride semiconductor crystal 10 by a wire saw, etc, and a polishing margin of a substrate after cutting. Further, in a case of forming a semiconductor layer of a device structure on the freestanding substrate to manufacture a device, when a rear surface of the freestanding substrate is polished after forming the semiconductor layer, the polishing margin in this device manufacturing step can be added to the thickness of the nitride semiconductor layer 1 with low dopant concentration.

The nitride semiconductor layer 2 with high dopant concentration is a layer used as the industrially useful n-type or p-type conductive nitride semiconductor freestanding substrate and the semi-insulating nitride semiconductor freestanding substrate. Accordingly, the thickness of the nitride semiconductor layer 2 with high dopant concentration is selected in consideration of the cutting margin for cutting the nitride semiconductor crystal 10 by the wire saw, etc, and the polishing margin of the substrate after cutting, in addition to a desired thickness of the nitride semiconductor freestanding substrate.

The "freestanding substrate" of the nitride semiconductor means the substrate having strength of not only keeping its own shape, but also not allowing inconvenience to occur in handling. In order to have such strength, the thickness of the nitride semiconductor freestanding substrate is preferably set to 200 μm or more.

The dopants contained in the nitride semiconductor crystal 10 are any one of the n-type dopants, p-type dopants, or semi-insulating dopants, or dopants in combination of them. As the n-type dopants, Si and Ge are given, as the p-type dopants, Mg and Zn are given, and as the semi-insulating dopants, Fe, etc, is given.

(Manufacturing Method of the Nitride Semiconductor Freestanding Substrate)

FIG. 2A to FIG. 2D show step views of the manufacturing method of the nitride semiconductor freestanding substrate according to an embodiment of the present invention.

Figure 2A:
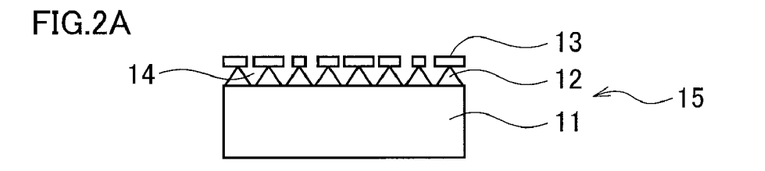
FIG. 2 is a step view showing an embodiment of a manufacturing method of the nitride semiconductor freestanding substrate according to the present invention.

In this embodiment, a VAS method (Void Assisted Separation method) is used to manufacture the nitride semiconductor crystal. FIG. 2A shows a base substrate (seed crystal substrate) 15 for growing the nitride semiconductor crystal used in this embodiment. The base substrate 15 is constituted in such a manner that GaN layer 12 is grown on a sapphire substrate 11 by MOVPE, etc, then Ti layer is vapor-deposited on a surface thereof, and thereafter heat treatment is applied thereto in hydrogen and ammonia, to thereby form voids 14 on the GaN layer 12 while converting the Ti layer to TiN13 of a net structure.

On the base substrate 15, the nitride semiconductor layer such as GaN layer is grown thick by HVPE, etc, to thereby form a nitride semiconductor crystal 20. The nitride semiconductor crystal 20 is formed, with a lamination thickness of 2 mm or more in which a nitride semiconductor layer 21 with low dopant concentration and a nitride semiconductor layer 22 with high dopant concentration are alternately laminated by 2 cycles or more, by repeating supply and stop of dopant materials at a prescribed interval, or repeating increase and decrease of an amount of supplying the dopant raw materials, during growth of the nitride semiconductor layer (FIG. 2B).

Figure 2B:
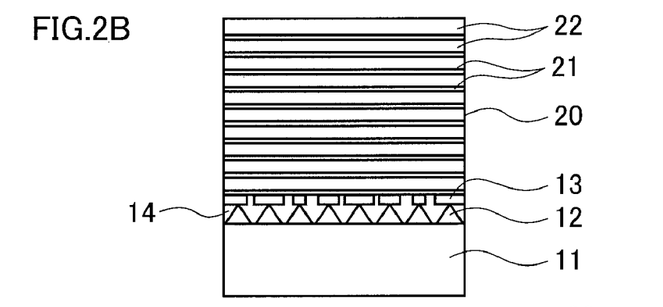

Note that in FIG. 2B, the nitride semiconductor layer 21 with low dopant concentration is formed on TiN13 in contact with TiN13. However, a thick nitride semiconductor layer with low dopant concentration having a thickness of 100 μm or more may be added between TiN13 and the nitride semiconductor layer 21 with low dopant concentration.

Figure 2C:
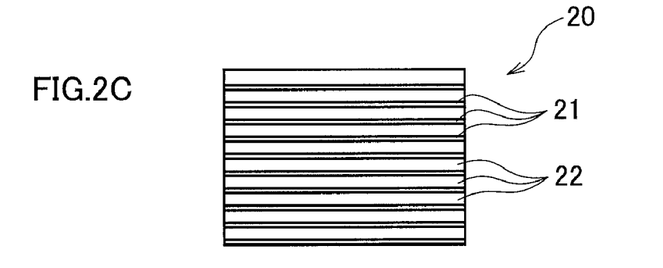

Thereafter, the sapphire substrate 11 is peeled off from the void portion 14, to thereby obtain the nitride semiconductor crystal 20 such as a freestanding GaN single crystal (FIG. 2C).

Note that the nitride semiconductor crystal may be manufactured not only by the VAS method, but also by methods such as DEEP method or an ammonothermal method, a high pressure synthesizing method, a sublimation method, and a Na flux.

Figure 2D:
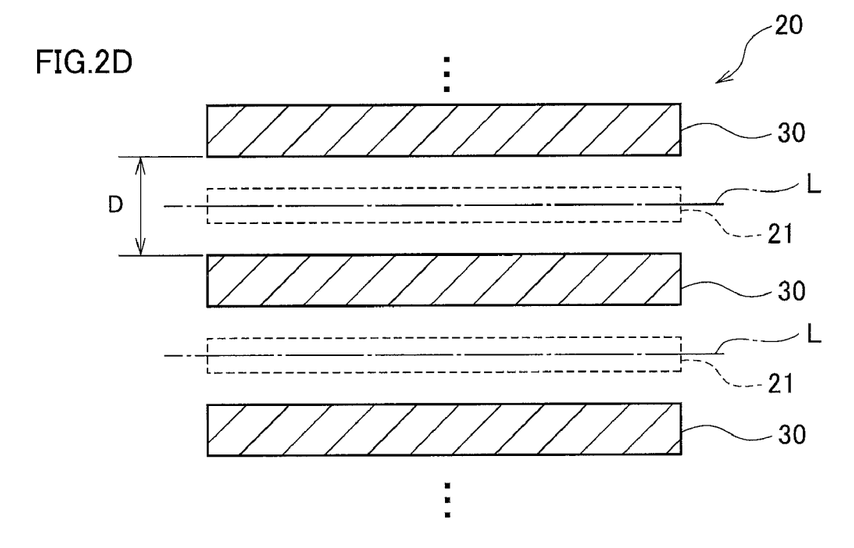

Subsequently, the obtained nitride semiconductor crystal 20 is sliced, to thereby manufacture the nitride semiconductor freestanding substrate. As shown in FIG. 2D, the nitride semiconductor crystal 20 is sliced along a cutting line L, with the nitride semiconductor layer 21 with low dopant concentration as a cutting position. The wire saw or an inner peripheral blade slicer, etc, is used in slicing. Polishing treatment is applied to the surface of the sliced and cutout nitride semiconductor substrate, so that the surface is flattened, to thereby obtain a nitride semiconductor freestanding substrate 30. The nitride semiconductor freestanding substrate 30 is composed of the nitride semiconductor layer 22 with high dopant concentration. Alternatively, the nitride semiconductor freestanding substrate is manufactured so that the nitride semiconductor layer 22 with high dopant concentration is set to be an uppermost surface. Thickness D portion obtained by adding the cutting margin by cutting, and the polishing margin by polishing, is removed from the nitride semiconductor crystal 20, to thereby define the thickness of the nitride semiconductor freestanding substrate 30.

The nitride semiconductor layer having each kind of device structure corresponding to light emitting/receiving devices such as LD, LED, PD, and electronic devices such as HEMT, HBT, is formed by lamination on the obtained nitride semiconductor freestanding substrate 30, by MOVPE and MBE (molecular beam epitaxy), to thereby manufacture a nitride semiconductor device thereon.

Figure 5:
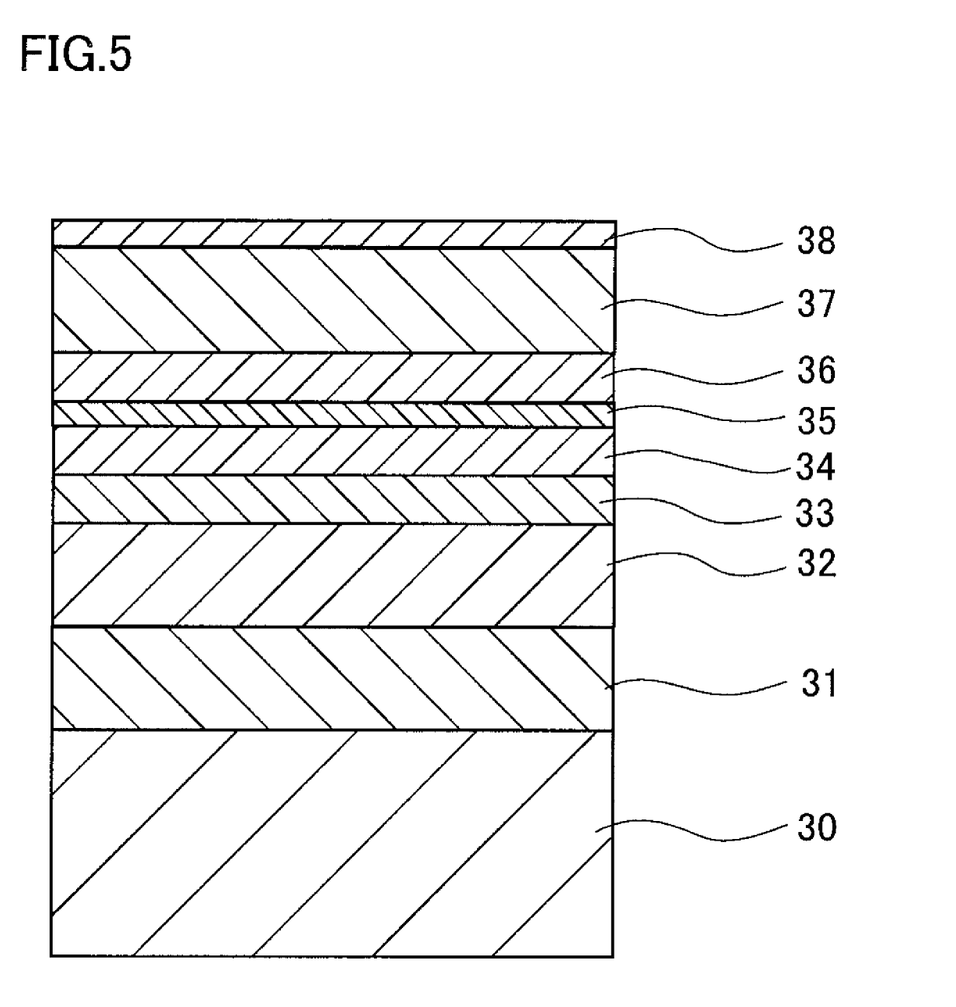
FIG. 5 is a cross-sectional view showing an embodiment of a laser diode according to the present invention.

FIG. 5 shows an example of manufacturing a bluish-purple laser diode, as an embodiment of the nitride semiconductor device. Namely, n-type GaN layer 31, n-type AlGaN layer 32, n-type GaN light guide layer 33, quantum well layer 34 having InGaN/GaN structure, p-type AlGaN layer 35, p-type GaN light guide layer 36, p-type AlGaN/GaN super lattice layer 37, and p-type GaN layer 38 are sequentially formed on the GaN freestanding substrate 30 by lamination using MOPVE. Further, although not shown, the laser diode is manufactured by forming electrodes and chipping, etc.

EXAMPLES

Next, examples of the present invention will be described.

Example 1

In example 1, GaN single crystal was manufactured as the nitride semiconductor crystal, by using the VAS method in the same way as the aforementioned embodiment shown in FIG. 2.

First, a void substrate was prepared as the base substrate. The void substrate was obtained by growing the GaN layer on the sapphire substrate with a thickness of about 300 nm by MOVPE, etc, vapor-depositing the Ti layer on the surface thereof, and thereafter applying heat treatment thereto in a mixed gas of hydrogen and ammonia, to thereby form the void of the GaN layer while converting the Ti layer having the net structure to TiN. As the sapphire substrate, the sapphire substrate having an inclined surface from C-plane in a range of 0.05° to 1° in the A-axis or M-axis direction, having a thickness of 300 to 800 μm and a diameter of 35 mm to 160 mm, was used. The thickness of the Ti layer at the time of manufacturing the void substrate was set to 5 nm to 100 nm.

Subsequently, the GaN layer was grown thick by HVPE on the void substrate, being the base substrate. The grown GaN layer has a structure of the alternate lamination of the GaN layer doped with Si with a thickness of 800 μm, and undoped GaN layer with a thickness of 200 μm (Si concentration is less than $3 \times 10^{14}$ cm$^{-3}$). The supply of Si raw material was stopped during growth of the undoped GaN layer.

After the GaN layer was grown by HVPE, the sapphire substrate was peeled off from a void formation part, to thereby obtain the freestanding GaN single crystal.

The GaN single crystal was manufactured with a thickness of 0.1 mm to 100 mm, under a growth condition of the GaN layer by HVPE, such as temperature of the void substrate set to 800° C. to 1200° C., the pressure in a HVPE apparatus set to 10 kPa to 120 kPa, and a growth rate set to 30 μm/hr to 1000 μm/hr. GaCl gas generated by spraying hydrochloric acid to metal gallium heated to 800° C. in the HVPE apparatus, was used as a group III raw material. Further, NH$_3$ gas was used as a group V raw material gas, and dichlorosilane gas (SiH$_2$Cl$_2$) was used as a Si raw material, being the n-type dopant. Further, hydrogen, nitrogen, or a mixed gas of them was used as a carrier gas.

Dislocation density of the GaN single crystal is determined by a thickness of the Ti layer during manufacturing the void substrate. As the Ti layer is thinner, dislocation in the GaN layer grown by MOVPE is easily propagated to the GaN thick film on the GaN thick layer thereon, and therefore the dislocation density becomes high. The dislocation density of the GaN single crystal obtained in a range of 5 to 100 nm of the thickness of the Ti layer, falls within a range of $1 \times 10^4$ cm$^{-2}$ ~ $1 \times 10^8$ cm$^{-2}$.

Further, the obtained GaN single crystal had a mirror face, with almost no pit on any surface after end of the growth. The GaN single crystal of $1 \times 10^{15}$ cm$^{-3}$ ~ $1 \times 10^{20}$ cm$^{-3}$ was manufactured by adjusting dichlorosilane flow rate during growth, as a Si concentration in the GaN single crystal.

Figure 3:
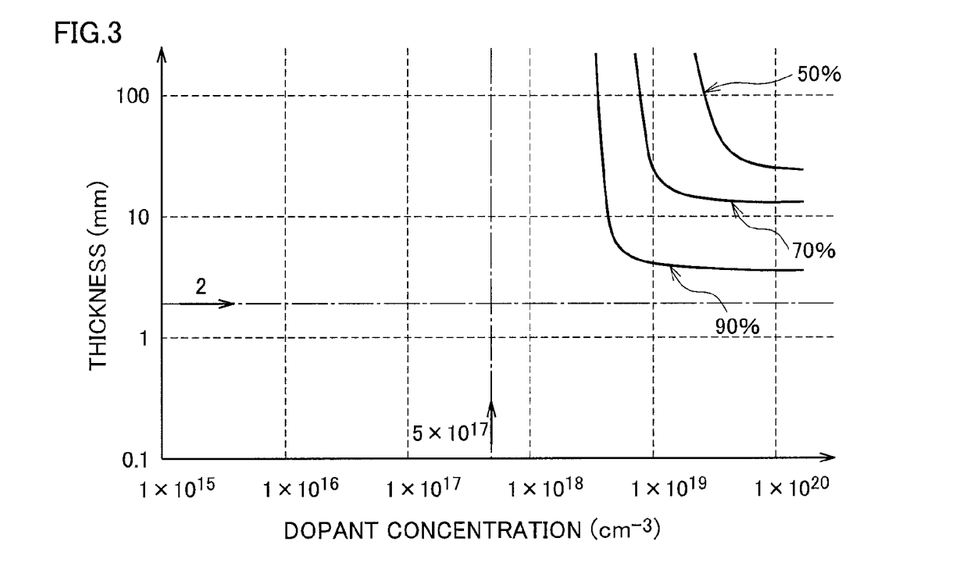
FIG. 3 is a graph showing a relation between a dopant concentration of Si-doped GaN layer, thickness of a GaN single crystal, and a growth yield of the GaN single crystal in the GaN single crystal according to an example of the present invention.

In the growth of the GaN single crystal with a diameter of 160 mm, FIG. 3 shows a dependency between the ratio (growth yield ratio (%)) for obtaining the GaN single crystal without cracks and breakage at the end of the growth, and the dopant concentration of the GaN layer doped with Si (Si concentration (cm$^{-3}$)) and the thickness (mm) of the GaN single crystal.

As shown in FIG. 3, even in a case of the GaN single crystal with dopant concentration being $1 \times 10^{19}$ cm$^{-3}$ and a thickness being 10 mm, the growth yield ratio of 70% or more was realized. FIG. 3 shows a result of the GaN single crystal with a diameter of 160 mm. Wherein, even in a case of other GaN single crystal with a diameter of 35 mm or more and less than 160 mm, almost the same result was shown.

Comparative Example

In a comparative example, Si was uniformly added to the GaN layer, with no lamination structure in which the GaN layer doped with Si and the undoped GaN layer are alternately laminated. Other conditions were set similar to those of the example 1.

Figure 4:
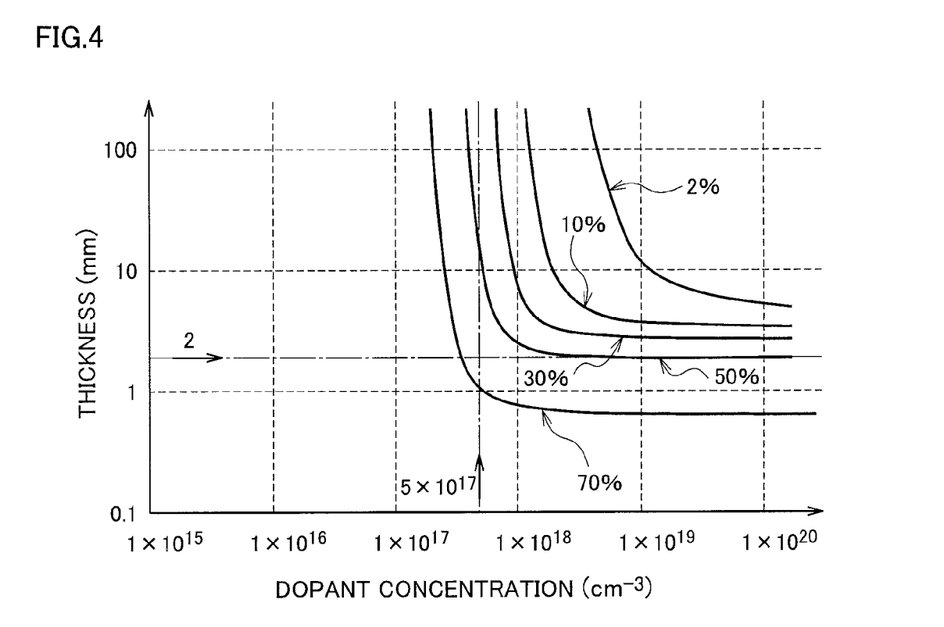
FIG. 4 is a graph showing a relation between the dopant concentration of the GaN single crystal, the thickness of the GaN single crystal, and the growth yield of the GaN single crystal in the GaN single crystal of a comparative example.

In the growth of the GaN single crystal with a diameter of 160 mm, FIG. 4 shows a dependency between the ratio (growth yield ratio (%)) for obtaining the GaN single crystal without cracks and breakage at the end of the growth, and the dopant concentration of the GaN layer doped with Si (Si concentration (cm$^{-3}$)) and the thickness (mm) of the GaN single crystal.

As shown in FIG. 4, when the thickness of the crystal is 2 mm or less, or when the dopant concentration (Si concentration) is $5 \times 10^{17}$ cm$^{-3}$ or less even if the crystal is thick, high growth yield ratio of 50% or more is obtained. However, when the dopant concentration is $5 \times 10^{17}$ cm$^{-3}$ or more, the growth yield ratio is rapidly decreased when the thickness of the crystal is 2 mm or more. When the aforementioned example 1 and the comparative example are compared, it is found that in the example 1, the growth yield ratio is tremendously improved. FIG. 4 shows a result of the GaN freestanding single crystal with a diameter of 160 mm. Even in a case of other GaN single crystal with a diameter of 35 mm or more and less than 160 mm, almost the same result was shown.

Example 2

An experiment similar to the example 1 was conducted by varying the thickness of the undoped GaN layer in a range of 10 μm to 500 μm. As a result, when the thickness of the undoped GaN layer was 40 μm or more, almost the same result as the example 1 was obtained. When the undoped GaN layer was thinner than 40 μm, such as 10 μm, 20 μm, and 30 μm, an effect of inserting the undoped GaN layer was not observed, and almost the same result as the comparative example was shown.

When the thickness of the undoped GaN layer is thinner than 40 μm, the ratio of the easily plastically deformed GaN layer doped with Si, and the undoped GaN layer, is excessively small, and therefore it can be considered that the effect of preventing the plastic deformation of the freestanding single crystal by the undoped GaN layer is not sufficient.

Actually, in the example 2, when the thickness of the GaN layer doped with Si is increased to 1200 μm from 800 μm of the example 1, the thickness of the undoped GaN layer needs to be set to 60 μm or more, to obtain the effect of improving the growth yield ratio by insertion of the undoped GaN layer. Further, when the thickness of the GaN layer doped with Si is 2000 μm, the thickness of the undoped GaN layer needs to be set to 100 μm or more to obtain the same result.

From the aforementioned result, it can be said that the thickness of the undoped GaN layer needs to be set to $1/20$ or more of the thickness of the GaN layer doped with Si, for growing the GaN single crystal with dopant concentration of the Si-doped GaN layer being $5 \times 10^{17}$ cm$^{-3}$ or more and a thickness being 2 mm or more, without breakage and cracks.

Example 3

The Si concentration of the GaN layer doped with Si was set to $5 \times 10^{17}$ cm$^{-3}$ or more, and the undoped GaN layer was replaced with a low Si concentration GaN layer, with Si doping amount set to less than $3 \times 10^{14} \sim 5 \times 10^{17}$ cm$^{-3}$ in example 2, and similar experiment was conducted. As a result, almost the same result as the example 2 was obtained.

Example 4

In examples 1 to 3, when the same experiment was conducted, with GaN changed to AlN, InN, $Al_xGa_{1-x}N$ (0<x<1), and $In_yGa_{1-y}N$ (0<y<1), almost the same result as the examples 1 to 3 was obtained.

Example 5

In examples 1 to 4, n-type dopant Si was changed to p-type dopants Mg, Zn, Be, to thereby grow a p-type nitride freestanding single crystal. In any case, almost the same result as the examples 1 to 4 was obtained.

Example 6

In the examples 1 to 4, the n-type dopant Si was changed to Fe, being the dopant that gives semi-insulating property, to thereby grow the semi-insulting nitride freestanding single crystal. In this case as well, almost the same result as the examples 1 to 4 was obtained.

Example 7

The nitride semiconductor single crystal with a thickness of 2 mm or more without breakage and cracks, which was grown in examples 1 to 6, was sliced by using the wire saw. In this case, slicing was performed by periodically arranging the wire at a position where the undoped layer or the layer having low dopant concentration exists, on the side face of the nitride semiconductor single crystal. A wire diameter was 200 μm, and free abrasive grains (diamond) were used. As a result, several to 100 sheets of substrates were obtained from one nitride semiconductor single crystal.

By polishing the front surface and rear surface of the obtained substrate, the nitride semiconductor freestanding substrate that could be used for forming a device was obtained. At this time, the undoped layer or the layer with low dopant concentration is remained on the rear surface of the obtained freestanding substrate, depending on the thickness of the undoped layer or the layer with low dopant concentration. However, at least about 100 μm of the front surface side of the freestanding substrate was sliced and polished to obtain the layer with high dopant concentration. Even in a case of forming either one of an optical device and an electronic device, ordinarily the substrate is made thin by polishing the rear surface at the time of mounting, until the thickness of about 100 μm is obtained. Therefore, even in a case that the undoped layer or the layer with low dopant concentration is remained on the rear surface to some extent, no practical problem is thereby generated.

Other Example

The same experiment as examples 1 to 7 was conducted, with the surface of the sapphire substrate set as R-plane, A-plane, M-plane or the other high index plane (for example, (11-22) plane). In this case as well, almost the same result as the examples 1 to 7 was obtained.

Further, the same experiment as the examples 1 to 7 was conducted, by growing the nitride semiconductor layer by using MBE, MOVPE, and a sublimation method, instead of HVPE. In any case, the same result as the examples 1 to 7 was obtained.

Further, the same experiment as the examples 1 to 7 was conducted by growing the nitride semiconductor layer by using the ammonothermal method, high pressure synthesizing method, sublimation method, and liquid phase epitaxy using Na flux (LPD), instead of the VAS method. In any case, the same result as the examples 1 to 7 was obtained.

By manufacturing devices such as LD, LED, and transistor by MBE and MOVPE on the nitride semiconductor freestanding substrate according to the aforementioned examples, the cost of the devices can be considerably reduced.

What is claimed is:

1. A nitride semiconductor crystal, comprising:
   laminated homogeneous nitride semiconductor layers, with a thickness of 2 mm or more,
   wherein the laminated homogeneous nitride semiconductor layers are constituted so that a nitride semiconductor layer with low dopant concentration and a nitride semiconductor layer with high dopant concentration are alternately laminated by two cycles or more.

2. The nitride semiconductor crystal according to claim 1, wherein a thickness of the nitride semiconductor layer with low dopant concentration is $1/20$ or more of a thickness of the nitride semiconductor layer with high dopant concentration.

3. The nitride semiconductor crystal according to claim 1, wherein the nitride semiconductor layer with low dopant concentration has a dopant concentration of less than $5 \times 10^{17}$ cm$^{-3}$, and the nitride semiconductor layer with high dopant concentration has a dopant concentration of $5 \times 10^{17}$ cm$^{-3}$ or more.

4. The nitride semiconductor crystal according to claim 1, wherein the dopant contained in the laminated homogeneous nitride semiconductor layers is any one of a n-type dopant, a p-type dopant, and a semi-insulating dopant.

5. The nitride semiconductor crystal according to claim 1, wherein the nitride semiconductor layer with low dopant concentration is an updoped nitride semiconductor layer.

6. The nitride semiconductor crystal according to claim 1, wherein the nitride semiconductor layer with high dopant concentration is a n-type or p-type conductive nitride semiconductor layer, with a carrier concentration being $1\times10^{18}$ cm$^{-3}$ or more.

7. The nitride semiconductor crystal according to claim 1, wherein the nitride semiconductor layer with high dopant concentration is a semi-insulating nitride semiconductor layer, with resistivity being $1\times10^5$ Ωcm or more.

8. The nitride semiconductor crystal according to claim 1, wherein the laminated homogeneous nitride semiconductor layers are GaN layers.

9. A manufacturing method of a nitride semiconductor freestanding substrate, comprising the steps of:
    forming a nitride semiconductor crystal with a thickness of 2 mm or more on a base substrate, composed of homogeneous nitride semiconductor layers, in which a nitride semiconductor layer with low dopant concentration and a nitride semiconductor layer with high dopant concentration, are laminated by 2 cycles or more; and
    slicing the nitride semiconductor crystal formed by lamination on the base substrate, with the nitride semiconductor layer with low dopant concentration as a cutting position.

10. The manufacturing method of the nitride semiconductor freestanding substrate according to claim 9, wherein the nitride semiconductor freestanding substrate is manufactured, with the nitride semiconductor layer with high dopant concentration set as at least a surface of the nitride semiconductor freestanding substrate.

11. The manufacturing method of the nitride semiconductor freestanding substrate according to claim 9, wherein a thickness of the nitride semiconductor layer with low dopant concentration is ¹⁄₂₀ or more of a thickness of the nitride semiconductor layer with high dopant concentration.

12. The manufacturing method of the nitride semiconductor freestanding substrate according to claim 9, wherein the nitride semiconductor layer with low dopant concentration has a dopant concentration of less than $5\times10^{17}$ cm$^{-3}$, and the nitride semiconductor layer with high dopant concentration has a dopant concentration of $5\times10^{17}$ cm$^{-3}$ or more.

13. The manufacturing method of the nitride semiconductor freestanding substrate according to claim 9, wherein the dopant contained in the homogeneous nitride semiconductor layers is any one of a n-type dopant, a p-type dopant, and a dopant that gives semi-insulating property.

14. The manufacturing method of the nitride semiconductor freestanding substrate according to claim 9, wherein the nitride semiconductor layer with low dopant concentration is an undoped nitride semiconductor layer formed without supplying dopant raw materials thereto.

15. The manufacturing method of the nitride semiconductor freestanding substrate according to claim 9, wherein the homogeneous nitride semiconductor layers are GaN layers.

16. The manufacturing method of the nitride semiconductor freestanding substrate according to claim 9, wherein HVPE is used in the step of forming the nitride semiconductor crystal.

17. A nitride semiconductor device, manufactured by forming the nitride semiconductor layers having a device structure by lamination, on the nitride semiconductor freestanding substrate manufactured by the manufacturing method of the nitride semiconductor freestanding substrate according to claim 9.

* * * * *